July 9, 1963 D. G. W. INGRAM 3,097,345
OSCILLATOR HAVING AMPLITUDE PROPORTIONAL TO INPUT SIGNAL
Filed Aug. 13, 1959
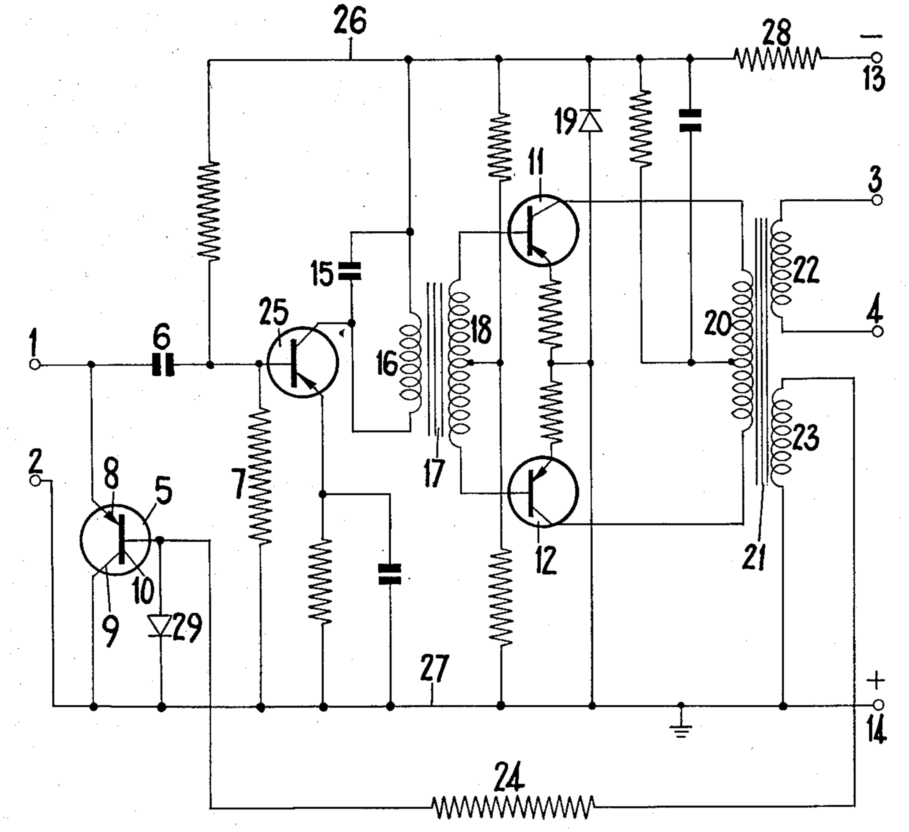
INVENTOR
DEREK GEORGE WOODWARD INGRAM
BY Kurschstein, Kurschstein & Ottinger
ATTORNEYS United States Patent Office 3,097,345
Patented July 9, 1963

3,097,345

OSCILLATOR HAVING AMPLITUDE PROPORTIONAL TO INPUT SIGNAL

Derek George Woodward Ingram, Harrow, England, assignor to The General Electric Company Limited, London, England Filed Aug. 13, 1959, Ser. No. 833,638
Claims priority, application Great Britain Aug. 15, 1958
6 Claims. (Cl. 331—109)

This invention relates to electric oscillators.

It is an object of the present invention to provide an improved electric oscillator in which the amplitude of the electric oscillations produced thereby is dependent upon the value of a variable input voltage applied to an input circuit of the oscillator.

According to the present invention, an electric oscillator comprises an amplifier, a modulator circuit which is arranged to supply to the amplifier an electric oscillation obtained by modulating the amplitude of a control oscillation with a variable input voltage, and a feedback circuit for supplying a portion of the output from the amplifier to the modulator circuit as the said control oscillation which portion has a value and a phase such that the arrangement is self oscillatory, the arrangement being such that the amplitude of the electric oscillation supplied by the amplifier upon the operation of the oscillator is substantially proportional to the value of the variable input voltage applied to the modulator circuit.

In a preferred arrangement the amplifier comprises a transistor amplifier.

The modulator circuit may be a shunt modulator circuit which employs a transistor and which is arranged to supply to the amplifier an electric oscillation obtained by modulating the amplitude of the control oscillation that is applied between the base and either the emitter electrode or collector electrode of the transistor with the variable input voltage that is applied between the emitter and collector electrodes of the transistor. It may be arranged that the value of the said control oscillation is such that the transistor operates under signal peak limiting conditions.

According to a feature of the present invention, an electric oscillator for supplying an electric oscillation having an amplitude dependent upon the value of a variable input voltage comprises an amplifier having an input circuit, a device to which the said input voltage is applied during operation of the oscillator and which is arranged to apply to the input circuit of the amplifier a portion of the said input voltage which portion is determined by the impedance of the device, the impedance of the said device being dependent upon the instantaneous value of a control signal applied thereto, and a path for feeding back a portion of the amplifier signal supplied by the amplifier to the said device as the said control signal, the phase of the control signal being such that the arrangement is self oscillatory and the amplitude of the oscillations supplied by the amplifier being dependent upon the value of the input voltage.

The said device may be connected in shunt relationship with the input circuit of the amplifier.

Preferably the shunt modulator circuit is arranged selectively either to produce zero phase difference or to produce 180° phase difference between any oscillation supplied thereto over the feed back circuit and the oscillation supplied thereby to the amplifier, depending upon the polarity of the variable input voltage. Under these conditions, the amplifier may be arranged to have a gain-frequency characteristic and a phase-frequency characteristic such that oscillation is maintained for only one polarity of the variable input voltage. Thus it may be arranged that the gain of the amplifier is sufficient to maintain oscillation at the frequency which corresponds to a phase shift of 180° in the amplifier and the feedback circuit but insufficient to maintain oscillation at the frequency corresponding to a phase shift of 360° in the amplifier and the feedback circuit so that only the polarity of the variable input voltage that corresponds to a 180° phase shift in the shunt modulator results in the conditions of sufficient gain and an overall phase shift of 360° through the shunt modulator circuit, the amplifier and the feed back circuit that are necessary for the arrangement to be self oscillatory. Alternatively the amplifier may be arranged to have a gain-frequency characteristic and a phase-frequency characteristic such that oscillation is maintained at a different frequency for each polarity of the variable input voltage. Thus it may be arranged that the gain of the amplifier is sufficient to maintain oscillation at the frequencies which correspond to 180° and 360° phase shift in the amplifier and the feedback circuit so that oscillation at one frequency occurs for the polarity of the variable input voltage that corresponds to 180° phase shift in the shunt modulator circuit and oscillation at another frequency occurs for the polarity of the variable input voltage that corresponds to zero phase shift in the shunt modulator circuit. With such an arrangement the oscillator may have a different sensitivity at each of the frequencies at which oscillation occurs. The sensitivity of the oscillator is the ratio of the amplitude of the electric oscillation supplied by the oscillator to the value of the corresponding variable input voltage.

In a preferred arrangement, the transistor in the shunt modulator circuit is of the junction type. The feedback circuit is connected for supplying a portion of the output from the amplifier in regenerative phase between the base and collector electrodes of the transistor. The oscillator is arranged to oscillate only when the polarity of the variable input voltage is such that the emitter electrode of the transistor in the shunt modulator circuit is negative relative to the associated collector electrode.

One embodiment of an electric oscillator in accordance with the present invention will now be described by way of example with reference to the accompanying drawing which shows the electric circuit of the oscillator.

Referring to the drawing, the electric oscillator has input terminals 1 and 2 and output terminals 3 and 4 and is arranged in the manner to be hereinafter described so that the amplitude of an electric oscillation supplied to its output terminals 3 and 4 is substantially proportional to the value of a variable input voltage which is applied to the input terminals 1 and 2, that is to say, the sensitivity of the oscillator is substantially constant. The oscillator is further arranged so that oscillation will occur only if the polarity of the variable input voltage is such that the terminal 1 is at a negative voltage with respect to the terminal 2 which is at earth potential.

The oscillator comprises a shunt modulator circuit, a transistor amplifier and a feedback circuit. The shunt modulator circuit employs a high frequency p-n-p type junction transistor 5 and has an output circuit which comprises a capacitor 6 and a resistor 7 connected in series between the emitter electrode 8 and the collector electrode 9 of the transistor 5. The capacitor 6 has a low impedance at the oscillator working frequency of 1 kilocycle per second so that substantially all of the output from the shunt modulator circuit is developed across the resistor 7. The input terminals 1 and 2 are connected to the emitter and collector electrodes respectively of the transistor 5.

The transistor amplifier comprises an intermediate amplifier stage employing a p-n-p type junction transistor 25 and a class B power output stage employing a pair of p-n-p type junction transistors 11 and 12. The low voltage power supply (not shown) for operating the transistors 25, 11 and 12 is connected to negative and positive supply terminals 13 and 14 respectively and the resulting voltage difference between the leads 26 and 27 is stabilised by means of a diode 19 displaying the Zener effect and a resistor 28. The transistor 25 is connected as a grounded emitter stage and has its base to emitter circuit connected across the resistor 7. The collector electrode of the transistor 25 is connected to a resonant circuit with is provided by a capacitor 15 connected across the primary winding 16 of a transformer 17 and which is tuned to the working frequency of the oscillator.

The transformer 17 has a centre-tapped secondary winding 18 which supplies the base to emitter circuits of the transistors 11 and 12 in anti-phase. These transistors 11 and 12 are each connected as a grounded emitter stage and their collector electrodes are connected to opposite ends of the centre-tapped primary winding 20 of an output transformer 21 so that the outputs of these transistors are combined additively. The inductance of this winding 20 is large so that it has substantially no effect upon the working frequency of the oscillator. The output transformer 21 has two secondary windings 22 and 23 of which the winding 22 is connected to the output terminals 3 and 4. The other winding 23 is connected in the feedback circuit whereby the signal induced in this winding is applied between the base 10 and the collector electrode 9 of the transistor 5 in the shunt modulator circuit as a control signal. The feedback circuit includes a current limiting resistor 24 and is arranged to feed back such a portion of the output from the transistors 11 and 12 that the transistor 5 operates under signal peak limiting conditions. Thus the amplitude of the electric oscillation fed back to the base 10 of the transistor 5 is large relative to the value of the control voltage applied between the terminals 1 and 2. Because of this, a silicon diode 29 is connected from the base 10 to earth to restrict the maximum base to emitter voltage of the transistor 5 to a value below that which is liable to cause breakdown between the base 10 and the emitter 8.

In operation of the oscillator, the variable input voltage supplied to the input terminals 1 and 2 comprises a direct current voltage or a low frequency alternating current voltage and is derived from a high impedance (low current capacity) source (not shown). By low frequency alternating current is meant an alternating current having a frequency which is low relative to the working frequency of the oscillator.

Because the transistor 5 operates under signal peak limiting conditions, the voltage of its base 10 changes rapidly from a maximum positive value to a maximum negative value. Thus the transistor 5 is switched from a non-conducting condition to a conducting condition and vice versa as the voltage of its base 10 follows the negative-going and positive-going excursions respectively of the control signal fed back through the feedback circuit. In its conductive state, the transistor 5 is effectively a short circuit across the input terminals 1 and 2 so that substantially none of the variable input voltage applied to those terminals appears across the resistor 7. When the transistor 5 is non-conducting, substantially all of the voltage applied to the input terminals 1 and 2 is applied across the resistor 7. Thus, it will be appreciated that the voltage signal applied between the base and emitter electrodes of the transistor 25 has a generally rectangular wave form of substantially the same amplitude as the variable input voltage and of the same frequency as the control signal fed back through the feedback circuit. Thus the shunt modulator circuit acts to amplitude modulate the control signal with the variable input voltage. Furthermore, since the polarity of the variable input voltage is such that the terminal 1 is negative with respect to the terminal 2, the base of the transistor 25 is at its maximum negative value when the base 10 of the transistor 5 is at its maximum positive value, that is to say, there is a 180° phase shift due to the shunt modulator circuit.

The voltage signal having a rectangular waveform is amplified by the transistor 25 in the intermediate amplifier stage and is applied to the resonant circuit provided by the capacitor 15 and the transformer 17. The resulting signal induced in the secondary winding 18 of this transformer 17 has a sinusoidal waveform and is amplified by the transistors 11 and 12 in the power amplifier stage to produce outputs in the secondary windings 22 and 23 of the output transformer 21. The feedback circuit is arranged so that the control signal induced in the winding 23 is fed back regeneratively to the transistor 5, that is to say, so that a positive-going signal applied between the base and the emitter electrode of the transistor 25 results in the application of a negative-going signal between the base 10 and the collector electrode 9 of the transistor 5 and vice versa. This factor coupled with the factor that the amplitude of the control signal fed back is large relative to the value of the variable input voltage results in the continued operation of the oscillator.

As previously described, the amplitude of the voltage signal applied between the base and the emitter electrode of the transistor 25 is substantially equal to the value of the variable input voltage. The transistor amplifier has a gain characteristic such that the amplitude of a signal induced in the winding 22 is proportional to the amplitude of the corresponding signal applied between the base and the emitter electrode of the transistor 25. Consequently the amplitude of the electric oscillation applied to the output terminals 3 and 4 is substantially proportional to the value of the variable input voltage applied to the input terminals 1 and 2. This electric oscillation may be rectified to give a direct current voltage which also is substantially proportional to the value of the variable input voltage.

If the polarity of the variable input voltage is reversed so that the terminal 1 is at a positive voltage with respect to the terminal 2, then the shunt modulator circuit acts to produce zero phase difference between signals applied across the resistor 7 and the corresponding signals applied between the base 10 and the collector electrode 9 of the transistor 5. Thus, when the base 10 of the transistor 5 is at its maximum positive voltage, this transistor is non-conducting and substantially all of the variable input voltage is applied across the resistor 7 so that the base of the transistor 25 attains its maximum positive voltage. Under these conditions, oscillation can only be maintained if the transistor amplifier is able to produce substantially the same gain as previously when operating at the frequency corresponding to 360° phase shift in the amplifier and the feedback circuit that is necessary for the regenerative feedback of the signal induced in the winding 23 through the feedback circuit to the transistor 5. Because of the resonant circuit provided by the capacitor 15 and the transformer 17, the gain of the amplifier at frequencies much removed from the designed working frequency of the oscillator is insufficient to maintain oscillation so that the electric oscillator cannot function under the conditions resulting from the aforesaid reversal in the polarity of the variable input voltage.

It will be appreciated that it is not necessary for the feedback circuit to be connected so that the signal induced in the winding 23 of the transformer 21 is applied between the base 10 and the collector electrode 9 of the transistor 5 in the shunt modulator circuit. Thus the oscillator will operate in the manner described above if the connections to the emitter electrode 8 and the collector electrode 9 of the transistor 5 are reversed and the said signal is applied between the base 10 and the emitter electrode 8.

It is found that the electric oscillator has good stability with respect to variations of temperature and supply voltage of the transistors employed. Even better stability may be obtained by the use of negative feedback for the transistors 25, 11 and 12 in the amplifier. This may be achieved by connecting the emitter electrode of the transistor 25 to the lower end of the winding 20 of the output transformer 21 by way of a resistor and a capacitor (not shown) and by disconnecting the capacitor that is in the emitter circuit of the transistor 25. The said resistor is then connected in series with the resistor in the emitter circuit of the transistor 25 in a circuit which is across part of the winding 20. Consequently by choosing suitable values for these resistors, any desired portion of the signal induced to this part of the winding 20 may be fed back degeneratively to the emitter electrode of the transistor 25. In an alternative arrangement (not shown) part of the signal induced in the output winding 22 of the transformer 21 is rectified and the resulting direct current is employed to provide a unidirectional voltage signal which is fed back degeneratively either across the input terminals 1 and 2 or in series with the collector-emitter circuit of the transistor 5.

The oscillator will operate only if the input voltage applied between the input terminals 1 and 2 has at least a predetermined value. This predetermined value varies with temperature and is at a minimum over a small range of temperatures that is dependent upon the type of the transistor 5 used in the shunt modulator circuit. In practice the temperatures in this range are usually higher than the temperatures at which operation of the oscillator normally occurs. It has been found that if a bias current of a few microamps is supplied to the base electrode 10 of the transistor 5, the temperatures at which said predetermined value of the input voltage is at a minimum are reduced by an amount depending upon the magnitude of said bias current. Thus it may be arranged that these temperatures coincide with the normal operating temperatures of the oscillator. To this end, the base electrode 10 of the transistor 5 may be connected to the lead 26 by way of a resistor (not shown) of value suitable for determining the value of the required bias current.

In the above embodiment the shunt modulator circuit is effectively an on/off switch connected in shunt relationship with the input terminals 1 and 2 and controlled by the signal fed back from the winding 23 of the output transformer 21. Therefore it will be appreciated that similar results are obtainable by employing a series modulator circuit which is effectively an on/off switch connected in series relationship with the input terminals 1 and 2 and by employing a ring modulator circuit which is effectively a changeover switch.

The electric oscillator described above may be employed in a communication system, such as a carrier telephony system, as part of an arrangement for regulating the level of electric message signals at a predetermined position in the system in accordance with the value of a pilot signal received with the message signals at that position. The pilot signal, which comprises an electric oscillation of predetermined frequency, is rectified to give a unidirectional voltage and the difference between this voltage and a reference voltage is applied between the input terminals 1 and 2 of the oscillator so that the terminal 1 is at a negative voltage with respect to the terminal 2. The electric oscillation supplied by the oscillator to its output terminals 3 and 4 is used to energise the heater of an indirectly heated thermistor which forms a variable resistance element in a variable attenuation network connected in one or more signalling channels of the system. It is thus arranged that the attenuation of electric message signals in the one or more signalling channels by the said attenuation network varies with the amplitude of the oscillation supplied by the electric oscillator which amplitude varies according to the value of the pilot signal. In this manner the electric message signals obtained from the said attenuation network for further transmission over the system are maintained at a substantially constant level which is determined by the said reference voltage.

I claim:

1. An electric oscillator for supplying an electric oscillation having an amplitude dependent upon the value of a variable input signal, said oscillator comprising input terminals to which said input signal is supplied during operation of the oscillator, an amplifier having an input circuit and an output circuit, circuit means connected between said input terminals and the input circuit of the amplifier, a variable impedance device which is included in said circuit means and which has an "on" condition wherein it presents an impedance to said input signal such that substantially all of that signal is applied to the amplifier and an "off" condition wherein it presents an impedance to said input signal such that substantially none of that signal is applied to the amplifier, control means of said variable impedance device by which that device is switched "off" and "on" respectively when a signal is and is not applied to that control means, an alternating current feedback path which is connected between the output circuit of the amplifier and said control means and over which part of the amplified input signal that is supplied by the amplifier only when said device is "on" is applied to said control means to switch said device "off" so that the arrangement oscillates, and resonance means included in said amplifier to determine the frequency at which the arrangement oscillates.

2. An electric oscillator according to claim 1 wherein said variable impedance device is connected in shunt relationship with said input terminals and with the input circuit of the amplifier.

3. An electric oscillator for supplying an electric oscillation having an amplitude substantially proportional to the value of a variable input signal, said oscillator comprising input terminals to which said input signal is supplied during operation of the oscillator, an amplfier having an input circuit and an output circuit, a transistor which has a base electrode, an emitter electrode and a collector electrode, circuit means which connects the emitter-collector path of said transistor and the input circuit of the amplifier across said input terminals so that a portion of said input signal is applied to said input circuit which portion is determined by the impedance of said emitter-collector path and hence is dependent upon the instantaneous value of a control singal supplied to the base electrode of said transistor, and an alternating current feedback path which is connected between the output circuit of the amplifier and said base electrode and which feeds back a portion of the amplified signal supplied by the amplifier to that base electrode as said control signal, the phase of the control signal being such that the arrangement is self-oscillatory.

4. An electric oscillator according to claim 3 wherein the emitter-collector path of the transistor and the input circuit of the amplifier are connected in parallel with one another by the circuit means across said input terminals.

5. An electric oscillator according to claim 3 wherein the amplifier employs transistors as its active elements.

6. An electric oscillator according to claim 3 wherein an asymmetrically conductive device is connected between the base and collector electrodes of the transistor so as to restrict the maximum base to emitter voltage to a value below that which is liable to cause breakdown between the base and emitter electrode.

References Cited in the file of this patent

UNITED STATES PATENTS

| | | |
|---|---|---|
| 2,721,977 | Rich | Oct. 25, 1955 |
| 2,839,685 | Kelly | June 17, 1958 |
| 2,900,608 | Carroll et al. | Aug. 18, 1959 |
| 2,968,738 | Pintell | Jan. 17, 1961 |